(12) United States Patent
Kolcuoglu et al.

(10) Patent No.: US 9,374,124 B2
(45) Date of Patent: Jun. 21, 2016

(54) APPARATUS AND METHODS FOR BIASING RADIO FREQUENCY SWITCHES

(71) Applicant: ANALOG DEVICES GLOBAL, Hamilton (BM)

(72) Inventors: Turusan Kolcuoglu, Istanbul (TR); Bilal Tarik Cavus, Istanbul (TR); Yusuf Alperen Atesal, Istanbul (TR)

(73) Assignee: ANALOG DEVICES GLOBAL, Hamilton (BM)

( * ) Notice: Subject to any disclaimer, the term of this patent is extended or adjusted under 35 U.S.C. 154(b) by 0 days.

(21) Appl. No.: 14/506,468

(22) Filed: Oct. 3, 2014

(65) Prior Publication Data
US 2016/0099743 A1    Apr. 7, 2016

(51) Int. Cl.
*H04B 1/44*    (2006.01)

(52) U.S. Cl.
CPC .................................... *H04B 1/44* (2013.01)

(58) Field of Classification Search
CPC .................................................. H03K 17/6871
USPC .................................. 455/26.1, 78, 333, 560
See application file for complete search history.

(56) References Cited

U.S. PATENT DOCUMENTS

| 5,878,331 | A * | 3/1999 | Yamamoto et al. ............. 455/83 |
| 8,421,438 | B2 | 4/2013 | Pratt et al. |
| 8,854,111 | B2 * | 10/2014 | Chih-Sheng .................. 327/427 |
| 2007/0069798 | A1 | 3/2007 | Kusachi |
| 2011/0254614 | A1 | 10/2011 | Huang et al. |
| 2014/0062218 | A1 | 3/2014 | Chih-Sheng |
| 2014/0062577 | A1 | 3/2014 | Chih-Sheng |
| 2014/0144240 | A1 | 5/2014 | Barlow et al. |
| 2015/0145587 | A1 | 5/2015 | Sigetani et al. |

FOREIGN PATENT DOCUMENTS

| WO | WO 2014/024340 A1 | 2/2014 |
| WO | WO 2014047823 A1 | 4/2014 |

OTHER PUBLICATIONS

Extended European Search Report dated Feb. 24, 2016 in European Application No. 15188132.3.

* cited by examiner

*Primary Examiner* — Tuan H Nguyen
(74) *Attorney, Agent, or Firm* — Knobbe Martens Olson & Bear LLP

(57) ABSTRACT

Apparatus and methods for radio frequency (RF) switches are provided herein. In certain implementations, an RF switching circuit includes an adaptive switch bias circuit that controls gate and/or channel voltages of one or more field effect transistor (FET) switches. Additionally, the adaptive switch bias circuit is powered by a power high supply voltage and a power low supply voltage, and can be used to selectively turn on or off the FET switches based on a state of one or more switch enable signals. The adaptive switch bias circuit adaptively biases that gate and/or channel voltages of the FET switches based on a voltage difference between the power high and power low supply voltages to provide switch biasing suitable for use with two or more different power supply voltage levels.

23 Claims, 5 Drawing Sheets

APPARATUS AND METHODS FOR BIASING RADIO FREQUENCY SWITCHES

BACKGROUND

1. Field

Embodiments of the invention relate to electronic systems, and more particularly, to biasing of radio frequency switches.

2. Description of the Related Technology

A radio frequency (RF) system can include RF switches used for a variety of purposes.

In one example, an RF system, such as a mobile device or base station, can include an antenna switch module (ASM) implemented using RF switches. Additionally, the antenna switch module can be used to electrically connect an antenna to a particular transmit or receive path of the system, thereby allowing multiple components to access the antenna.

In another example, an RF system can include a digital step attenuator (DSA), and the DSA can include RF switches that are turned on or off to control an amount of attenuation provided by the DSA.

SUMMARY

In one aspect, a radio frequency (RF) switching circuit includes one or more field effect transistor (FET) switches including a first FET switch, and an adaptive switch bias circuit configured to control a gate voltage and a channel voltage of the first FET switch. The adaptive switch bias circuit is configured to receive a switch enable signal. Additionally, the adaptive switch bias circuit is configured to bias the first FET switch with a turn-on voltage to turn on the first FET switch when the switch enable signal is in a first state, and to bias the first FET switch with a turn-off voltage to turn off the first FET switch when the switch enable signal is in a second state. The adaptive switch bias circuit is configured to be powered by a power high supply voltage and a power low supply voltage. The adaptive switch bias circuit is configured to control a magnitude of the turn-on voltage and a magnitude of the turn-off voltage based on a voltage difference between the power high supply voltage and the power low supply voltage.

In another aspect, an electronically implemented method of biasing an RF switch is provided. The method includes powering an adaptive switch bias circuit using a power high supply voltage and a power low supply voltage, controlling a magnitude of a turn-on voltage and a magnitude of a turn-off voltage based on a voltage difference between the power high supply voltage and the power low supply voltage, receiving a switch enable signal as an input to the adaptive switch bias circuit, and controlling a gate voltage and a channel voltage of a first FET switch using the adaptive switch bias circuit. Controlling the gate voltage and the channel voltage of the first FET switch includes biasing the first FET switch using the turn-on voltage when the switch enable signal is in a first state, and biasing the first FET switch using the turn-off voltage when the switch enable signal is in a second state.

In another aspect, an RF system is provided. The RF system includes a FET switch electrically connected in a signal path of the RF system, and an adaptive switch bias circuit configured to control a gate voltage and a channel voltage of the FET switch. The adaptive switch bias circuit is configured to receive a switch enable signal. Additionally, the adaptive switch bias circuit is configured to bias the FET switch with a turn on voltage to turn on the FET switch when the switch enable signal is in a first state, and to bias the FET switch with a turn-off voltage to turn off the FET switch when the switch enable signal is in a second state. The adaptive switch bias circuit is configured to be powered by a power high supply voltage and a power low supply voltage, and the adaptive switch bias circuit is configured to control a magnitude of the turn-on voltage and a magnitude of the turn-off voltage based on a voltage difference between the power high supply voltage and the power low supply voltage.

DETAILED DESCRIPTION OF EMBODIMENTS

Figure 1:
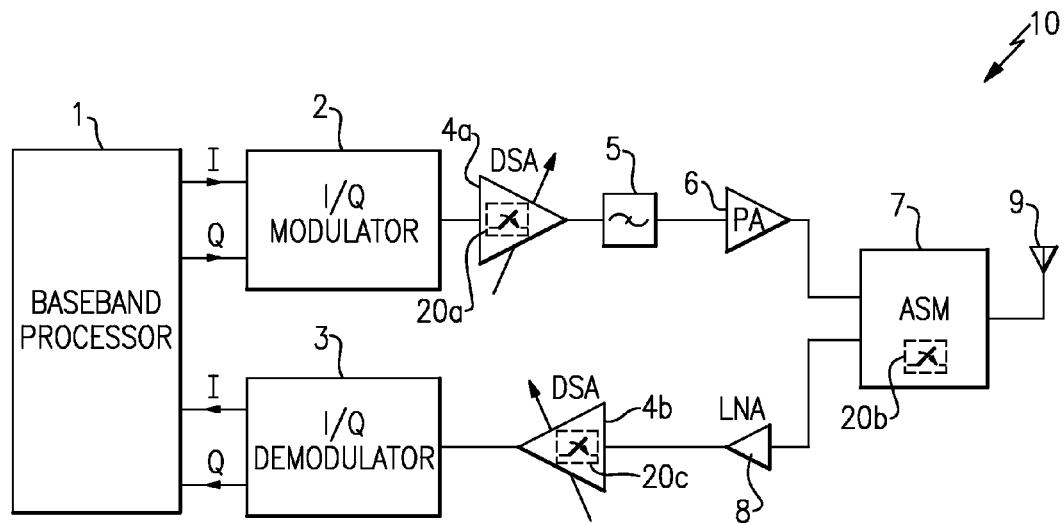
FIG. 1 is a schematic diagram of one example of a radio frequency (RF) system that can include one or more RF switching circuits in accordance with the teachings herein.

The following detailed description of embodiments presents various descriptions of specific embodiments of the invention. However, the invention can be embodied in a multitude of different ways as defined and covered by the claims. In this description, reference is made to the drawings where like reference numerals may indicate identical or functionally similar elements.

Provided herein are apparatus and method for radio frequency (RF) switches. In certain implementations, an RF switching circuit includes an adaptive switch bias circuit that controls gate and/or channel voltages of one or more field effect transistor (FET) switches. Additionally, the adaptive switch bias circuit is powered by a power high supply voltage and a power low supply voltage, and can be used to selectively turn on or off the FET switches based on a state of one or more switch enable signals. The adaptive switch bias circuit adaptively biases the FET switches based on a voltage difference between the power high and power low supply voltages to provide switch biasing suitable for use with two or more different power supply voltage levels. For example, the adaptive switch bias circuit can control a magnitude of a switch turn-on voltage and a magnitude of a switch turn-off voltage based on the voltage difference between the power high and power low supply voltages.

By adaptively biasing the FET switches, the RF switching circuit can be used in a variety of electronic systems and/or applications. For example, the adaptive switch bias circuit can provide different bias voltage levels to the FET switches when powered using external power supply voltages of different voltage levels. By providing an RF switching circuit that is adaptively biased in this manner, the RF switching circuit can be used in applications utilizing different external power supply voltage levels, while avoiding a need to manufacture multiple integrated circuit or chip variations associated with different RF switch designs suitable for use with a particular external supply voltage level.

Adaptive switch biasing can be used to achieve a desired trade-off between ON state impedance and OFF state power handling, which can aid in meeting or exceeding performance specifications associated with insertion loss, power handling, linearity, distortion, and/or RF isolation. Moreover, the adaptive switch bias circuits can be used to control gate and/or channel bias voltages to levels compliant with transistor maximum overvoltage and/or reliability constraints.

FIG. 1 is a schematic diagram of one example of an RF system 10 that can include one or more RF switching circuits in accordance with the teachings herein.

Although, the RF system 10 illustrates one example of an electronic system that can include RF switching circuits as described herein, RF switching circuits can be used in other configurations of electronic systems. Additionally, although a particular configuration of components is illustrated in FIG. 1, the RF system can be adapted and modified in a wide variety of ways. For example, the RF system 10 can include more or fewer receive and/or transmit paths. Additionally, the RF system 10 can be modified to include more or fewer components and/or a different arrangement of components, including, for example, a different arrangement of RF switching circuits.

In the illustrated configuration, the RF system 10 includes a baseband processor 1, an I/Q modulator 2, an I/Q demodulator 3, a first digital step attenuator 4a, a second digital step attenuator 4b, a filter 5, a power amplifier 6, an antenna switch module 7, a low noise amplifier 8, and an antenna 9.

As shown in FIG. 1, baseband processor 1 generates an in-phase (I) transit signal and a quadrature-phase (Q) transmit signal, which are provided to the I/Q modulator 2. Additionally, the baseband processor 1 receives an I receive signal and a Q receive signal from the I/Q demodulator 3. The I and Q transmit signals correspond to signal components of a sinusoidal wave or transmit signal of a particular amplitude, frequency, and phase. For example, the I transmit signal and Q transmit signal represent an in-phase sinusoidal component and quadrature-phase sinusoidal component, respectively, and can be an equivalent representation of the transmit signal. Additionally, the I and Q receive signals correspond to signal components of a receive signal of a particular amplitude, frequency, and phase.

In certain implementations, the I transmit signal, the Q transmit signal, the I receive signal, and the Q receive signal can be digital signals. Additionally, the baseband processor 1 can include a digital signal processor, a microprocessor, or a combination thereof, used for processing the digital signals.

The I/Q modulator 2 receives the I and Q transmit signals from the baseband processor 1 and processes them to generate a modulated RF signal. In certain configurations, the I/Q modulator 2 can include DACs configured to convert the I and Q transmit signals into an analog format, mixers for upconverting the I and Q transit signals to radio frequency, and a signal combiner for combining the upconverted I and Q signals into the modulated RF signal.

The first digital step attenuator 4a receives the modulated RF signal, and attenuates the modulated RF signal to generate an attenuated RF signal. The first digital step attenuator 4a can aid in obtaining a desired gain and/or power level associated with transmission. In the illustrated configuration, the first digital step attenuator 4a includes a first RF switching circuit 20a. The first digital step attenuator 4a illustrates one example of a circuit that can include one or more RF switching circuits in accordance with the teachings herein. For example, the first digital step attenuator 4a can include a cascade of attenuator stages, each of which can be bypassed using a RF switching circuit to aid in providing a digitally adjustable amount of attenuation.

The filter 5 receives the attenuated RF signal from the first digital step attenuator 4a, and provides a filtered RF signal to an input of the power amplifier 6. In certain configurations, the filter 5 can be a bandpass filter configured to provide band filtering. However, the filter 5 can be a low pass filter, a band pass filter, or a high pass filter, depending on the application.

The power amplifier 6 can amplify the filtered RF signal to generate an amplified RF signal, which is provided as to the antenna switch module 7. The antenna switch module 7 is further electrically connected to the antenna 9 and to an input of the low noise amplifier 8. The antenna switch module 7 can be used to selectively connect the antenna 9 to the output of the power amplifier 6 or to the input of the low noise amplifier 8.

In the illustrated configuration, the antenna switch module 7 includes a second RF switching circuit 20b. The antenna switch module 7 illustrates another example of a circuit that can include one or more RF switching circuits in accordance with the teachings here. For example, the antenna switch module 7 can include an RF switching circuit implemented as a single pole multi-throw switch. Although FIG. 1 illustrates a configuration in which the antenna switch module 7 operates as a double pole single throw switch, the antenna switch module 7 can be adapted to include additional poles and/or throws.

The LNA 8 receives an antenna receive signal from the antenna switch module 7, and generates an amplified antenna receive signal that is provided to the second digital step attenuator 4b. The second digital step attenuator 4b can attenuate the amplified antenna receive signal by a digitally-controllable amount of attenuation. As shown in FIG. 1, the second digital step attenuator 4b generates an attenuated receive signal, which is provided to the I/Q demodulator 3. Including the second digital step attenuator 4b can aid in providing the I/Q demodulator 3 with a signal that has a desired amplitude and/or power level. In the illustrated configuration, the second digital step attenuator 4b includes a third RF switching circuit 20c. The second digital step attenuator 4b illustrates another example of a circuit that can include one or more RF switching circuits in accordance with the teachings herein.

The I/Q demodulator 3 can be used to generate the I receive signal and the Q receive signal, as was descried earlier. In certain configurations, the I/Q demodulator 3 can include a pair of mixers for mixing the attenuated receive signal with a pair of clock signals that are about ninety degrees out of phase. Additionally, the mixers can generate downconverted signals, which can be provided to ADCs used to generate the I and Q receive signals.

The RF system 10 can be used for transmitting and/or receiving RF signals using a variety of communication standards, including, for example, Global System for Mobile Communications (GSM), Code Division Multiple Access (CDMA), wideband CDMA (W-CDMA), Long Term Evolution (LTE), 3G, 3GPP, 4G, and/or Enhanced Data Rates for GSM Evolution (EDGE), as well as other proprietary and non-proprietary communications standards.

Providing an RF switch in a transmit or receive path of an RF system can impact the system's performance. For example, when an RF switch path is included in a transmit path of a transceiver, the RF switch can undesirably have insertion loss when operating in an ON or closed state. For example, the insertion loss can be associated with loss of signal power due to resistive losses. Furthermore, when the RF switch is operating in an OFF or opened state, the RF switch may nevertheless have a finite OFF state impedance that can impact RF isolation. For example, the RF switch can impact a wide variety of RF performance specifications, such as adjacent channel power ratio (ACPR). Additionally, when an RF switch is turned off but is positioned in a shunt configuration along an active signal path, the finite OFF state impedance of the RF switch can also lead to signal loss.

Accordingly, the ON state and OFF state performance of an RF switch can be important for a wide variety of reasons.

Figure 2:
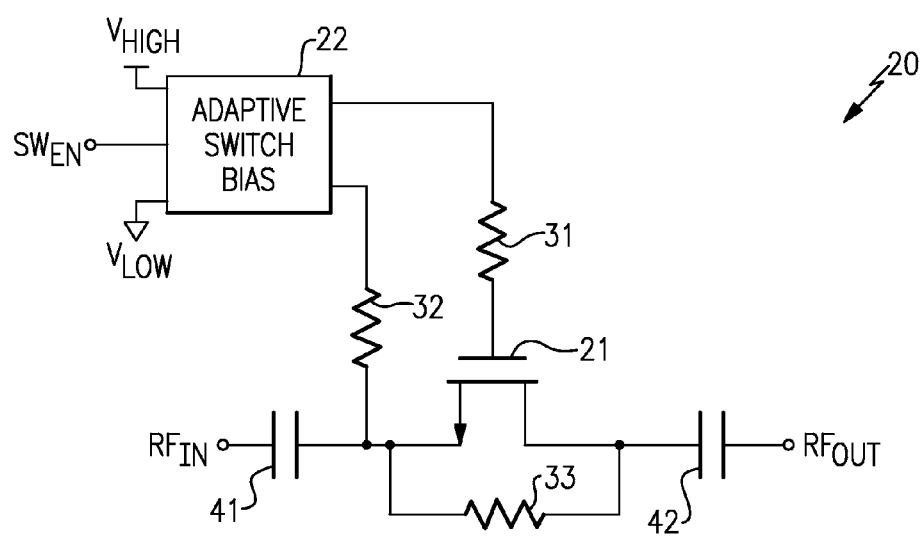
FIG. 2 is a circuit diagram of an RF switching circuit according to one embodiment.

FIG. 2 is a circuit diagram of an RF switching circuit 20 according to one embodiment. The RF switching circuit 20 includes an n-type field effect transistor (NFET) switch 21, an adaptive switch bias circuit 22, a gate bias resistor 31, a first channel bias resistor 32, a second channel bias resistor 33, a first or input DC blocking capacitor 41, and a second or output DC blocking capacitor 42. The RF switching circuit 20 is powered using a power high supply voltage $V_{HIGH}$ and a power low supply voltage $W_{LOW}$, and includes an RF input $RF_{IN}$, an RF output $RF_{OUT}$, and a switch enable input $SW_{EN}$.

Although FIG. 2 illustrates a configuration in which the adaptive switch bias circuit 22 is used to bias one FET switch, the adaptive switch bias circuit 22 can be configured to bias one or more additional FET switches. In such configurations, the adaptive switch bias circuit can include additional switch enable inputs, such as a switch enable input associated with each FET switch. However, other configurations are possible, such as implementations in which a switch enable signal is used control multiple FET switches. For example, in one embodiment, an RF switching circuit includes a series FET switch electrically connected between a first terminal and a second terminal, and a shunt switch electrically connected between the first terminal and a power low supply voltage. Additionally, the series FET switch and the shunt FET switch can controlled by a common switch enable signal such that when the series FET switch is turned on the shunt FET switch is turned off, and such that when the shunt FET switch is turned on the series FET switch is turned off.

In the illustrated configuration, a source of the NFET switch 21 is electrically connected to the RF input $RF_{IN}$ through the first DC blocking capacitor 41, and a drain of the NFET switch 21 is electrically connected to the RF output $RF_{OUT}$ through the second DC blocking capacitor 42. Additionally, the gate bias resistor 31 is electrically connected between a gate bias output of the adaptive switch bias circuit 22 and a gate of the NFET switch 21. Furthermore, the first channel bias resistor 32 is electrically connected between a channel bias output of the adaptive switch bias circuit 22 and the source of the NFET switch 21, and the second channel bias resistor 33 is electrically connected between the source and drain of the NFET switch 21 in parallel with the NFET switch's channel.

The adaptive switch bias circuit 22 is powered by the power high supply voltage $V_{HIGH}$ and the power low supply voltage $W_{LOW}$, and can be used to turn on or off the NFET switch 21 using the switch enable input $SW_{EN}$. As will be described in detail below, the adaptive switch bias circuit 22 can be used to adaptively bias the gate and/or channel of the NFET switch 21 based on a voltage difference between the power high and power low supply voltages $V_{HIGH}$, $V_{LOW}$.

The first and second DC blocking capacitors 41, 42 can aid the adaptive switch bias circuit 22 in biasing the NFET switch 21. For example, the first DC blocking capacitor 41 can permit the source of the NFET switch 21 to be biased at a different DC voltage level than the RF input $RF_{IN}$, and the second DC blocking capacitor 42 can permit the drain of the NFET switch 21 to be biased at a different DC voltage level than the RF output $RF_{OUT}$.

The gate bias resistor 31 can enhance isolation between the gate bias output of the adaptive switch bias circuit 22 and the gate of the NFET switch 21. For example, high frequency signal components can be coupled onto the gate of the NFET switch 21 via parasitic gain-to-drain and/or gate-to-source capacitances, and the gate bias resistor 31 can provide resistance that impedes the high frequency signal components from reaching the gate bias output of the adaptive switch bias circuit 22.

Additionally, the first and second channel bias resistors 32, 33 can enhance isolation between the channel bias output of the adaptive switch bias circuit 22 and the channel of the NFET switch 21. For example, the first channel bias resistor 32 can provide resistance that impedes high frequency signal components present at the source of the NFET switch 21 from reaching the channel bias output of the adaptive switch bias circuit 22. The second channel bias resistor 33 can bias the drain of the NFET switch 21 with a channel bias voltage generated by the adaptive switch bias circuit 22.

Although the second channel bias resistor 33 is illustrated as being electrically connected between the source and drain of the NFET switch 21, in other configurations the second channel bias resistor 33 can be electrically connected between the drain of the NFET switch 21 and the channel bias output of the adaptive switch bias circuit 22. However, the illustrated configuration can provide lower noise injection into the channel bias output of the adaptive switch bias circuit 22 relative to a configuration using similar resistance values in which the second channel bias resistor is directly connected between the drain of the NFET switch 21 and the channel bias output of the adaptive switch bias circuit 22.

Although the illustrated configuration shows a biasing scheme using gate and channel resistors, other implementations are possible. For example, an NFET switch can be biased using inductors or a combination of resistors and inductors.

The NFET switch 21 can be implemented in a variety of ways. In one embodiment, the NFET switch 21 is implemented as a silicon-on-insulator (SOI) metal oxide semiconductor (MOS) transistor including a body that is electrically floating. As used herein and as persons having ordinary skill in the art will appreciate, MOS transistors can have gates made out of materials that are not metals, such as poly silicon, and can have dielectric regions implemented not just with silicon oxide, but with other dielectrics, such as high-k dielectrics.

Although FIG. 2 illustrates a configuration using n-type transistors, the teachings herein are applicable to configurations using p-type transistors or a combination of n-type and p-type transistors.

The RF switching circuit 20 can be used in a wide variety of configurations within an electronic system. For example, the NFET switch 21 can operate in a transmit or receive signal path of an RF system, such as the RF system 10 of FIG. 1.

It can be desirable for the NFET switch 21 to have both low ON state impedance and high OFF state power handling. For example, a FET switch with poor ON state impedance can have high insertion loss, which can lead to a decrease in power of a signal propagating through the FET switch due to resistive losses. Additionally, a FET switch with high ON state impedance can exhibit poor linearity, which can lead to signal distortion and/or degradation of a third-order intercept (IP3) specification.

Accordingly, it can be important for the NFET switch 21 to have a relatively low ON state impedance such that the NFET switch 21 provides low insertion loss when the NFET switch 21 operates in a signal path. Furthermore, it can be important for the NFET switch 21 to have relatively high OFF state power handling. Providing the NFET switch 21 with high OFF state power handling enhances performance to meet or exceed one-decibel compression point (P1dB) specifications.

Although it can be desirable for the NFET switch 21 to have both low ON state impedance and high OFF state power handling, there can often be a trade-off between decreasing ON state impedance and increasing OFF state power handling for certain levels of power supply voltages, for example, when the voltage difference between the power high supply voltage $V_{HIGH}$ and the power low supply voltage $W_{LOW}$ is smaller than the voltage difference between an on-state gate-to-source ($V_{GS}$) voltage that gives best ON state impedance and an off-state $V_{GS}$ voltage that gives best OFF state power handling.

Additionally, the NFET switch's ON state impedance and OFF state power handling can be constrained by transistor overvoltage limitations. For example, a voltage difference between the power high supply voltage $V_{HIGH}$ and the power low supply voltage $V_{LOW}$ may be greater than a maximum gate-to-source voltage and/or gate-to-drain voltage that the NFET switch 21 can reliably withstand. Thus, it may not be feasible to bias the NFET switch 21 with an ON state gate-to-source voltage ($V_{GS}$) or turn-on voltage of $V_{HIGH}-V_{LOW}$, and/or to bias the NFET switch 21 with an OFF state $V_{GS}$ or turn-off voltage equal to $V_{LOW}-V_{HIGH}$.

Thus, the NFET switch's ON state impedance and OFF state power handling can also be constrained by power supply voltage levels. In certain configurations, the sum of the switch turn-on voltage and the switch turn-off voltage can be selected to be about equal to the voltage difference between the power high supply voltage $V_{HIGH}$ and the power low supply voltage $V_{LOW}$. Additionally, increasing the switch turn-on voltage can result in a corresponding decrease in the switch turn-off voltage, and decreasing the switch turn-on voltage can result in a corresponding increase in the switch turn-on voltage. Thus, there can be a trade-off between the switch turn-off voltage and switch turn-on voltage. When a switch operates with a large turn-on voltage and small turn-off voltage, the switch can have low on-state resistance but poor power handling. Additionally, when the switch operates with a small turn-on voltage and large turn-off voltage, the on-state resistance can be high but the power handling can increase, since the switch can remain off even in the presence of large RF signal swings at the switch's source and/or drain.

The adaptive switch bias circuit 22 can be used to dynamically control the gate and/or channel bias voltages of the NFET switch 21 based on the voltage difference between the power high supply voltage $V_{HIGH}$ and the power low supply voltage $W_{LOW}$. For example, the adaptive switch bias circuit can control a magnitude of a switch turn-on voltage and a magnitude of a switch turn-off voltage based on the voltage difference between the power high and power low supply voltages $V_{HIGH}$, $V_{LOW}$. The adaptive switch bias circuit 22 can be used to bias the NFET switch 21 to provide ON state and OFF state bias voltages that achieve a desired trade-off between ON state impedance and OFF state power handling while meeting transistor maximum overvoltage specifications.

For example, the adaptive switch bias circuit 22 can provide different levels of voltage bias to the NFET switch 21 when powered using different external supply voltage levels. By providing an RF switching circuit that can be adaptively biased in this manner, the RF switching circuit can be used in applications utilizing different external supply voltage levels, while avoiding a need to manufacture multiple RF switching circuit variations suitable for use with a particular external supply voltage level.

In order to reduce manufacturing cost, it can be desirable to use integrated circuits fabricated using the same mask set to provide RF switching in a variety of applications associated with different external supply voltage levels. By including the adaptive switch bias circuit 22, the RF switching circuit 20 can operate using desirable ON state and OFF state bias voltages when operated with different external supply voltage levels, and a need for manufacturing multiple IC variations associated with different mask sets can be avoided.

In one example, the adaptive switch bias circuit 22 can adaptively bias the NFET switch 21 with desirable ON state and OFF state voltages when operated with an external supply voltage of +3.3 V or with an external supply voltage of +5.0 V. Thus, an end-user or customer of an integrated circuit that includes the RF switching circuit 20 can achieve optimum RF switching functionality regardless of whether the customer desires to use a +3.3 V or a +5.0 V supply.

Figure 3A:
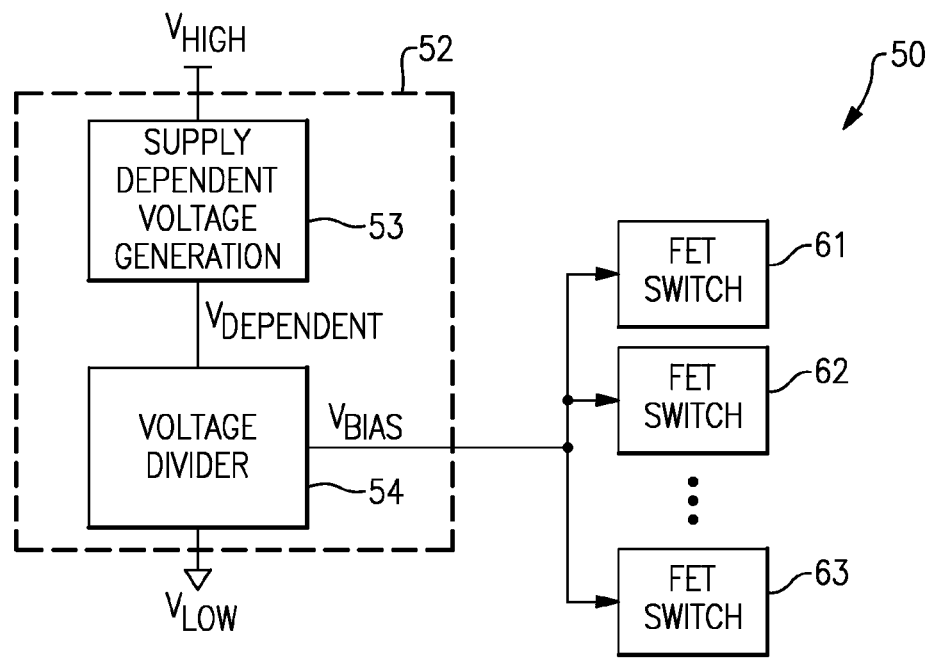
FIG. 3A is a circuit diagram of an RF switching circuit according to another embodiment.

FIG. 3A is a circuit diagram of an RF switching circuit 50 according to another embodiment. The RF switching circuit 50 includes a first FET switch 61, a second FET switch 62, a third FET switch 63, and an adaptive switch bias circuit 52. Although FIG. 3A illustrates a configuration using three FET switches, the RF switching circuit 50 can be adapted to include more or fewer FET switches.

The illustrated adaptive switch bias circuit 52 includes a supply dependent voltage generation circuit 53 and a voltage divider 54. Additionally, the adaptive switch bias circuit 52 is powered using a power high supply voltage $V_{HIGH}$ and a power low supply voltage $V_{LOW}$. Although not illustrated in FIG. 3A for clarity of the figures, the adaptive switch bias circuit 52 can receive one or more switch enable signals for turning on or off the FET switches 61-63. The adaptive switch bias circuit 52 can use a wide variety of switch control schemes for turning on or off the FET switches 61-63 using switch enable signals, including, but not limited to, the switch control schemes discussed further below with reference to FIGS. 4A-4B.

The supply dependent voltage generation circuit 53 receives the power high supply voltage $V_{HIGH}$ and generates a supply dependent voltage $V_{DEPENDENT}$, which has a voltage level that changes based on a voltage level of the power high supply voltage $V_{HIGH}$. Thus, in contrast to a voltage regulator that generates a fixed or regulated voltage when provided with a power high supply voltage, the illustrated supply dependent voltage generation circuit 53 generates the supply dependent voltage $V_{DEPENDENT}$ to have a voltage level that changes with the power high supply voltage $V_{HIGH}$. In one embodiment, the voltage of the supply dependent voltage $V_{DEPENDENT}$ is shifted and/or scaled relative to the power high supply voltage $V_{HIGH}$.

In the illustrated configuration, the supply dependent voltage $V_{DEPENDENT}$ is provided to the voltage divider 54, which generates a bias voltage $V_{BIAS}$ based on a voltage dividing operation between the supply dependent voltage $V_{DEPENDENT}$ and the power low supply voltage $V_{LOW}$. For example, the bias voltage $V_{BIAS}$ can correspond to a fraction of the voltage difference between the supply dependent voltage $V_{DEPENDENT}$ and the power low supply voltage $V_{LOW}$.

The bias voltage $V_{BIAS}$ can be used to bias the first to third FET switches 61-63 is a variety of ways. For example, in one embodiment, the bias voltage $V_{BIAS}$ is used to control the gate voltages of the first to third FET switches 61-63. In another embodiment, the bias voltage $V_{BIAS}$ is used to control the channel voltages of the first to third FET switches 61-63.

The bias voltage $V_{BIAS}$ can adaptively change based on a voltage difference between the power high supply voltage $V_{HIGH}$ and the power low supply voltage $V_{LOW}$. By controlling a division ratio of the voltage divider 54 and a voltage relationship or mapping between the power high supply voltage $V_{HIGH}$ and the supply dependent voltage $V_{DEPENDENT}$, a desired adaptive bias can be achieved. The adaptive bias can be selected to provide desired ON state and OFF state voltages for the first to third FET switches 61-63.

Figure 3B:
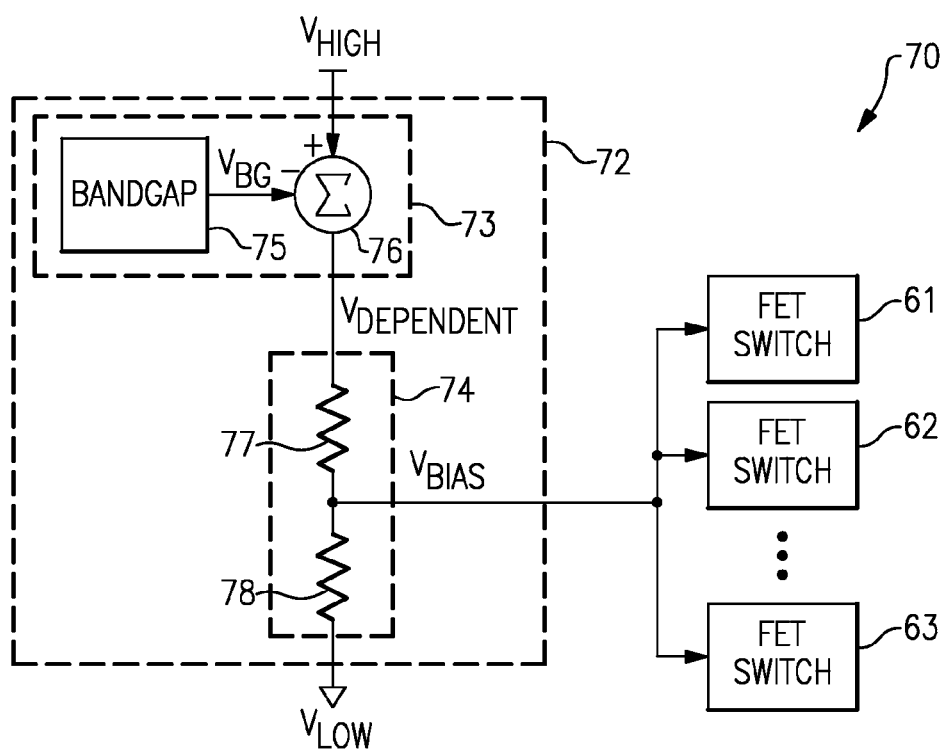
FIG. 3B is a circuit diagram of an RF switching circuit according to another embodiment.

FIG. 3B is a circuit diagram of an RF switching circuit 70 according to another embodiment. The RF switching circuit 70 includes the first to third FET switches 61-63 and an adaptive switch bias circuit 72.

The RF switching circuit 70 of FIG. 3B is similar to the RF switching circuit 50 of FIG. 3A, except that the RF switching circuit 70 of FIG. 3B illustrates a specific configuration of an adaptive switch bias circuit 72. As shown in FIG. 3B, the adaptive switch bias circuit 72 includes a supply dependent voltage generation circuit 73 that includes a bandgap voltage reference circuit or bandgap circuit 75 and a subtraction circuit 76. Additionally, the adaptive switch bias circuit 72 includes a voltage divider 74 that includes a first resistor 77 and a second resistor 78.

The illustrated bandgap circuit 75 generates a bandgap reference voltage $V_{BG}$, which can typically be in the range of about 1.2 V to 1.3 V. As persons having ordinary skill in the art will appreciate, the bandgap circuit 75 can be used to generate a reference voltage having a substantially fixed or constant voltage, even in the presence of power supply variations, temperature changes, and/or output loading constraints.

As shown in FIG. 3B, the subtraction circuit 76 can be used to subtract the bandgap reference voltage $V_{BG}$ from the power high supply voltage $V_{HIGH}$ to generate the supply dependent voltage $V_{DEPENDENT}$. Accordingly, in the illustrated configuration, the supply dependent voltage $V_{DEPENDENT}$ can be about equal to $V_{HIGH}-V_{BG}$, and thus the supply dependent voltage $V_{DEPENDENT}$ corresponds to a shifted version of the power high supply voltage $V_{HIGH}$ in this configuration.

The illustrated voltage divider 74 includes the first and second resistors 77, 78, which are electrically connected in series between the supply dependent voltage $V_{DEPENDENT}$ and the power low supply voltage $V_{LOW}$. Additionally, the voltage divider 74 generates the bias voltage $V_{BIAS}$, which can be based on a voltage difference between the supply dependent voltage $V_{DEPENDENT}$ and the power low supply voltage $V_{LOW}$ and a resistance ratio between the first and second resistors 77, 78.

The bias voltage $V_{BIAS}$ can adaptively change based on a voltage difference between the power high supply voltage $V_{HIGH}$ and the power low supply voltage $V_{LOW}$. For example, when the power low supply voltage $V_{LOW}$ corresponds to a ground supply having a voltage equal to 0 V, the bias voltage $V_{BIAS}$ can have a voltage about equal to $(V_{HIGH}-V_{BG})*R_2/(R_1+R_2)$, where $R_1$ is the resistance of the first resistor 77 and $R_2$ is the resistance of the second resistor 78.

For purposes of illustration only, in one example, the power low supply voltage $V_{LOW}$ is about equal to 0 V, the bandgap reference voltage $V_{BG}$ is about equal to 1.2 V, and the resistor ratio $R_2/(R_1+R_2)$ is about equal to 0.641. Additionally, the bias voltage $V_{BIAS}$ is applied to a gate of a FET switch, and the channel is controlled to either the power low supply voltage $V_{LOW}$ or the power high supply voltage $V_{HIGH}$ to turn on or off the FET switch. In such a configuration, the bias voltage $V_{BIAS}$ can be about equal to 1.35 V when the power high supply voltage $V_{HIGH}$ is about equal to 3.3 V, which can correspond to an ON state gate-to-source ($V_{GS}$) voltage or turn-on voltage of about 1.95 V and an OFF state source-to-gate ($V_{SG}$) voltage or turn-off voltage of about 1.35 V. Additionally, the bias voltage $V_{BIAS}$ can be about equal to 2.44 V when the power high supply voltage $V_{HIGH}$ is about equal to 5.0 V, which can correspond to an ON state gate-to-source ($V_{GS}$) voltage of about 2.56 V and an OFF state source-to-gate ($V_{SG}$) voltage of about 2.44 V. Although one specific example of voltage levels and resistance ratios is provided for purposes of illustration only, other values are possible.

By controlling a resistance ratio of the voltage divider 74 and a voltage mapping between the power high supply voltage $V_{HIGH}$ and the supply dependent voltage $V_{DEPENDENT}$, a desired adaptive bias can be achieved for two or more voltage levels of the power high supply voltage $V_{HIGH}$. Additionally, the adaptive biasing can provide desired ON state and OFF state FET bias voltages.

By adaptively biasing the FET switches, the RF switching circuit 70 can be used in applications utilizing different external supply voltage levels. The adaptive biasing can achieve desired ON state impedance and OFF state power handling for a particular power supply voltage level, which can aid in achieving a desired balance or optimization with respect to insertion loss, power handling, linearity, distortion, and/or RF isolation.

In certain configurations, the switch biasing can be achieved automatically in response to an end-user applying an external power supply voltage of a particular voltage level. Accordingly, enhanced flexibility and/or ease of use is provided by avoiding to need to program an IC with configuration data and/or blow fuses to control switch bias voltage levels.

In other configurations, the switch biasing can be controlled by an end-user or programmed during manufacture to achieve performance desired for a particular application. For example, in one embodiment, an RF switching circuit includes a control circuit including a programmable memory, and the voltage levels associated with turn-on and turn-off voltages for different power supply voltages can be based on data stored in the programmable memory. For example, the data stored in the programmable memory can be used, for instance, to achieve desired switch bias voltages by controlling a division ratio of a voltage divider and/or a voltage mapping between a power high supply voltage and a supply dependent voltage. However, the stored data can be used to achieve desired switch bias voltages in other ways.

In certain implementations, the programmable memory can be a volatile memory programmed to include data corresponding to the desired switch bias voltages during power up or turn on and/or programmed with the data during operation. In other implementations, the programmable memory can be a non-volatile memory, including, for example, a flash memory, a read only memory (ROM), and/or a memory implemented using fuses and/or anti fuses, and the non-volatile memory can be programmed with the data during manufacture. In such a configuration, the RF switching circuit can be used in a variety of different applications by programming the programmable memory with a certain switch bias voltages suitable for a particular application.

Figure 4A:
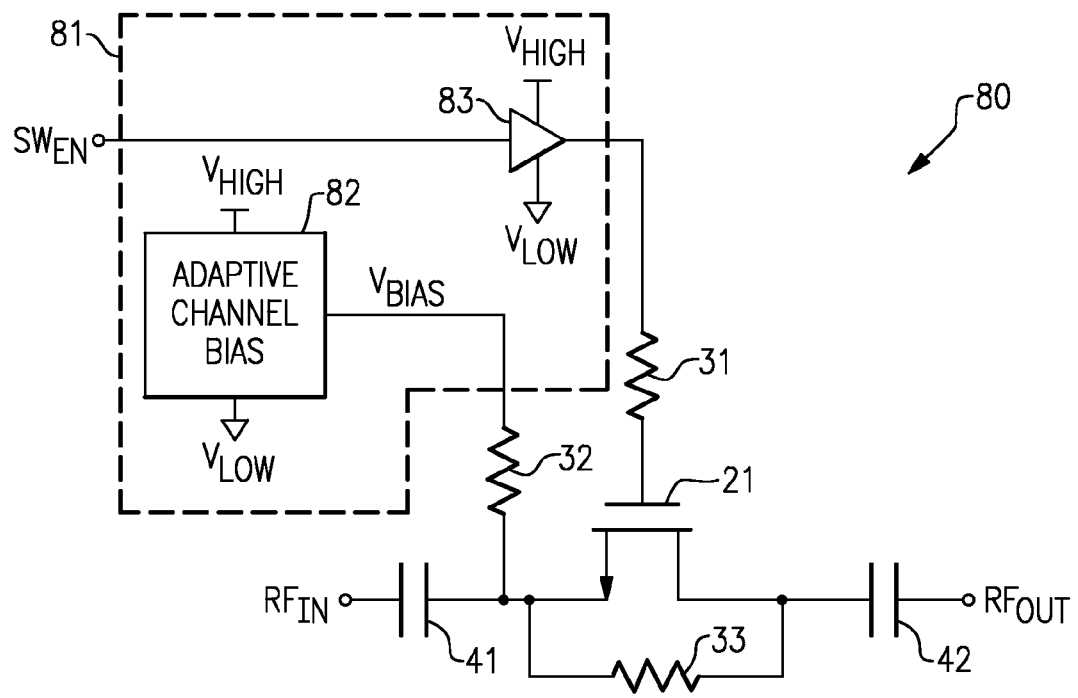
FIG. 4A is a circuit diagram of an RF switching circuit according to another embodiment.

FIG. 4A is a circuit diagram of an RF switching circuit 80 according to another embodiment. The RF switching circuit 80 includes the NFET switch 21, the gate bias resistor 31, the first channel bias resistor 32, the second channel bias resistor 33, the first DC blocking capacitor 41, and the second DC blocking capacitor 42, which can be as described earlier with respect to FIG. 2. The RF switching circuit 80 further includes an adaptive switch bias circuit 81. The RF switching circuit 20 is powered using the power high supply voltage $V_{HIGH}$ and the power low supply voltage $V_{LOW}$, and includes the RF input $RF_{IN}$, the RF output $RF_{OUT}$, and the switch enable input $SW_{EN}$.

The illustrated adaptive switch bias circuit 81 includes an adaptive channel bias circuit 82 and a switch control logic circuit 83. The adaptive channel bias circuit 82 is powered using the power high supply voltage $V_{HIGH}$ and the power low supply voltage $V_{LOW}$, and generates a bias voltage $V_{BIAS}$ that is used to bias the channel of the NFET switch 21. The bias voltage $V_{BIAS}$ can adaptively change based on a voltage difference between the power high supply voltage $V_{HIGH}$ and the power low supply voltage $V_{LOW}$. In certain configurations, the adaptive channel bias circuit 82 can include a supply dependent voltage generation circuit and a voltage divider, such as those shown in FIGS. 3A and/or 3B. However, other configurations are possible.

The switch control logic circuit 83 is powered using the power high supply voltage $V_{HIGH}$ and the power low supply voltage $V_{LOW}$, and can be used to control a gate voltage of the NFET switch 21 based on a state of a switch enable signal received at the switch enable input $SW_{EN}$. Accordingly, the illustrated RF switching circuit 80 illustrates a scheme in which an adaptive bias voltage is provided to the channel of a FET switch, and the FET switch is turned on or off by controlling a gate voltage of the FET based on a state of a switch enable signal. For example, when the switch control logic circuit 83 turns on the NFET switch 21, the NFET switch's gate-to-source voltage ($V_{GS}$) or turn-on voltage can be about equal to $V_{HIGH}-V_{BIAS}$. Additionally, when the switch control logic circuit 83 turns off the NFET switch 21, the NFET switch's source-to-gate voltage ($V_{SG}$) or turn-off voltage can be about equal to $V_{BIAS}-V_{LOW}$. Although one example of switch biasing has been described, other configurations are possible.

Although the switch control logic circuit 83 is illustrated as a buffer circuit, the switch control logic circuit 83 can be implemented in a variety of ways, including, for example, using logic circuitry such as one or more inverters, NAND gates, and/or NOR gates.

Figure 4B:
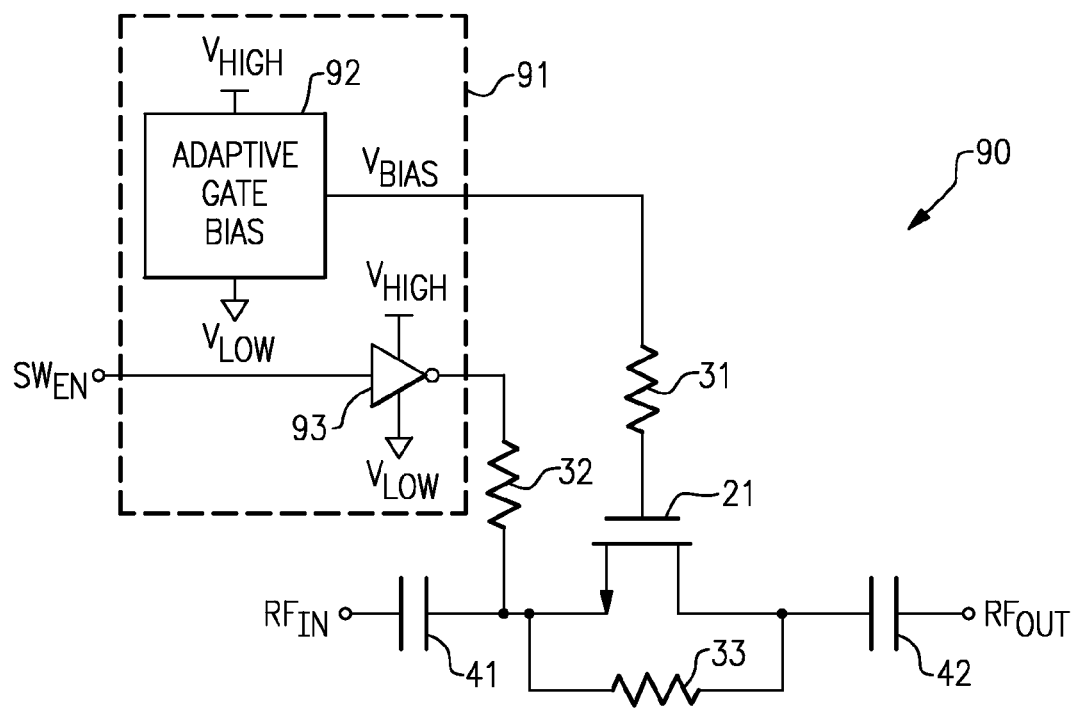
FIG. 4B is a circuit diagram of an RF switching circuit according to another embodiment.

FIG. 4B is a circuit diagram of an RF switching circuit 90 according to another embodiment. The RF switching circuit 90 of FIG. 4B is similar to the RF switching circuit 80 of FIG. 4A, except that the RF switching circuit 90 of FIG. 4B includes a different configuration of an adaptive switch biasing circuit.

For example, the illustrated RF switching circuit 90 includes an adaptive switch biasing circuit 91 that includes an adaptive gate bias circuit 92 and a switch control logic circuit 93. The adaptive gate bias circuit 92 is powered using the power high supply voltage $V_{HIGH}$ and the power low supply voltage $V_{LOW}$, and generates a bias voltage $V_{BIAS}$ that is used to bias the gate of the NFET switch 21. In certain configurations, the adaptive gate bias circuit 92 can include a supply dependent voltage generation circuit and a voltage divider, such as those shown in FIGS. 3A and/or 3B. However, other configurations are possible.

The switch control logic circuit 93 is powered using the power high supply voltage $V_{HIGH}$ and the power low supply voltage $V_{LOW}$, and can be used to control a channel voltage of the NFET switch 21 based on a state of a switch enable signal received at the switch enable input $SW_{EN}$. Accordingly, the illustrated RF switching circuit 90 illustrates a scheme in which an adaptive bias voltage is provided to the gate of a FET switch, and the FET switch is turned on or off by controlling a channel voltage of the FET switch. In the illustrated configuration, the switch control logic circuit 93 is illustrated as an inverter circuit. However, the switch control logic circuit 93 can be implemented in a variety of ways. Additional details of the RF switching circuit 90 can be as described earlier.

Figure 5:
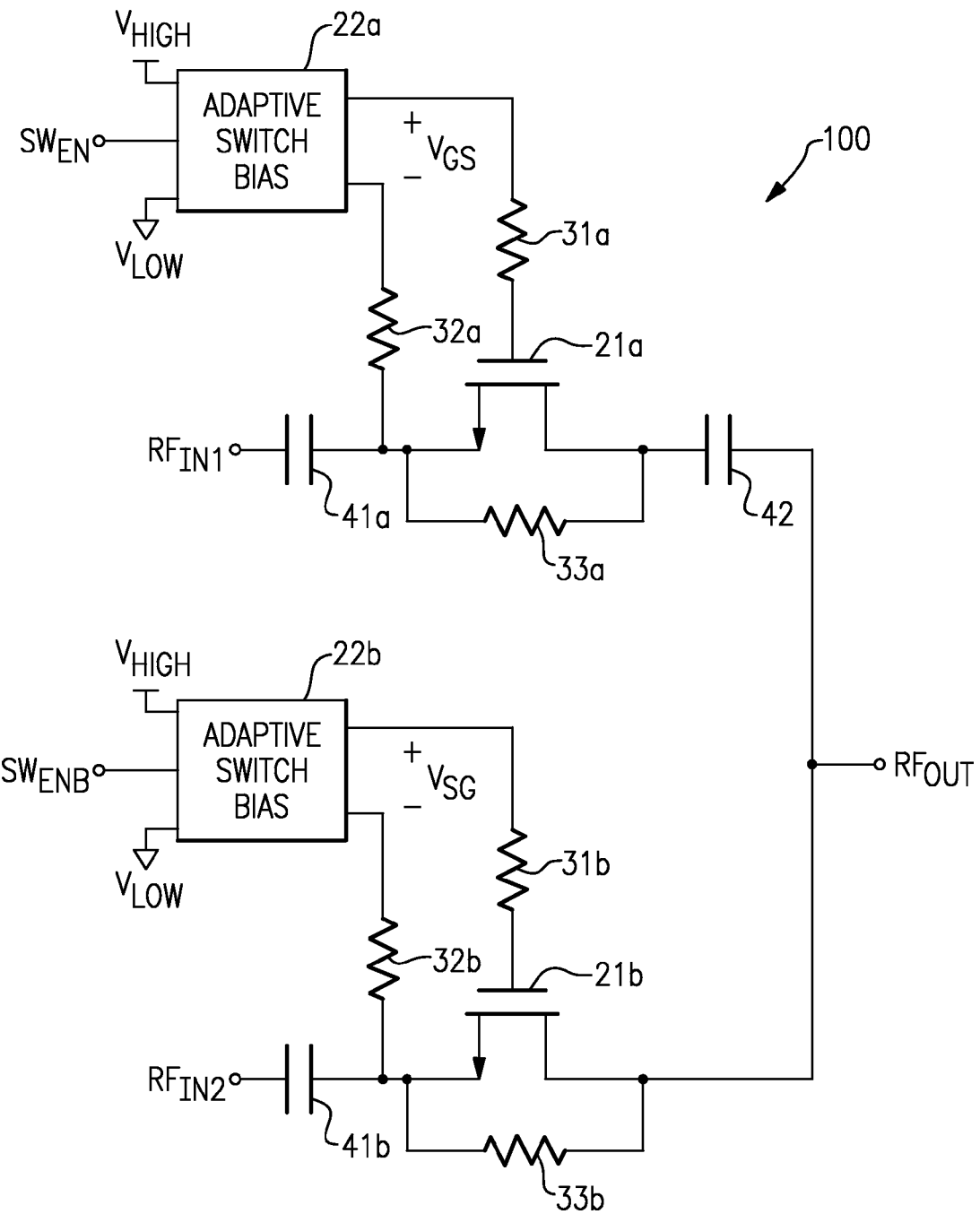
FIG. 5 is a circuit diagram of an RF switching circuit according to another embodiment.

FIG. 5 is a circuit diagram of an RF switching circuit 100 according to another embodiment.

The RF switching circuit 100 includes a first NFET switch 21a, a second NFET switch 21b, a first adaptive switch bias circuit 22a, a second adaptive switch bias circuit 22b, a first gate bias resistor 31a, a second gate bias resistor 31b, a first pair of channel bias resistors 32a, 33a, a second pair of channel bias resistors 32b, 33b, a first input DC blocking capacitor 41a, a second input DC blocking capacitor 41b, and an output DC blocking capacitor 42. The RF switching circuit 100 is powered using the power high supply voltage $V_{HIGH}$ and the power low supply voltage $V_{LOW}$, and includes a first RF input $RF_{IN1}$, a second RF input $RF_{IN2}$, an RF output $RF_{OUT}$, a non-inverted switch enable input $SW_{EN}$, and an inverted switch enable input $SW_{ENB}$.

The RF switching circuit 100 illustrates one embodiment of a multi-throw switch in accordance with the teachings herein. The first adaptive switch bias circuit 22a can be used to bias the gate and/or channel voltages of the first NFET switch 21a to turn on or off the first NFET switch 21a. Additionally, the second adaptive switch bias circuit 22b can be used to bias the gate and/or channel voltages of the second NFET switch 21b to turn on or off the second NFET switch 21b. In certain configurations, the first and second adaptive switch bias circuits 22a, 22b are implemented with a similar circuit configuration such that they bias the first and second NFET switches 21a, 21b, respectively, with similar ON state and OFF state voltages. However, other configurations are possible, such as configurations in which the first and second adaptive switch bias circuits 22a, 22b are implemented with different circuit configurations to provide a desired overall performance of the multi-throw switch.

Although the illustrated RF switching circuit 100 is illustrated as including two FET switches, the RF switching circuit 100 can be adapted to include a different number of FET switches.

Figure 6:
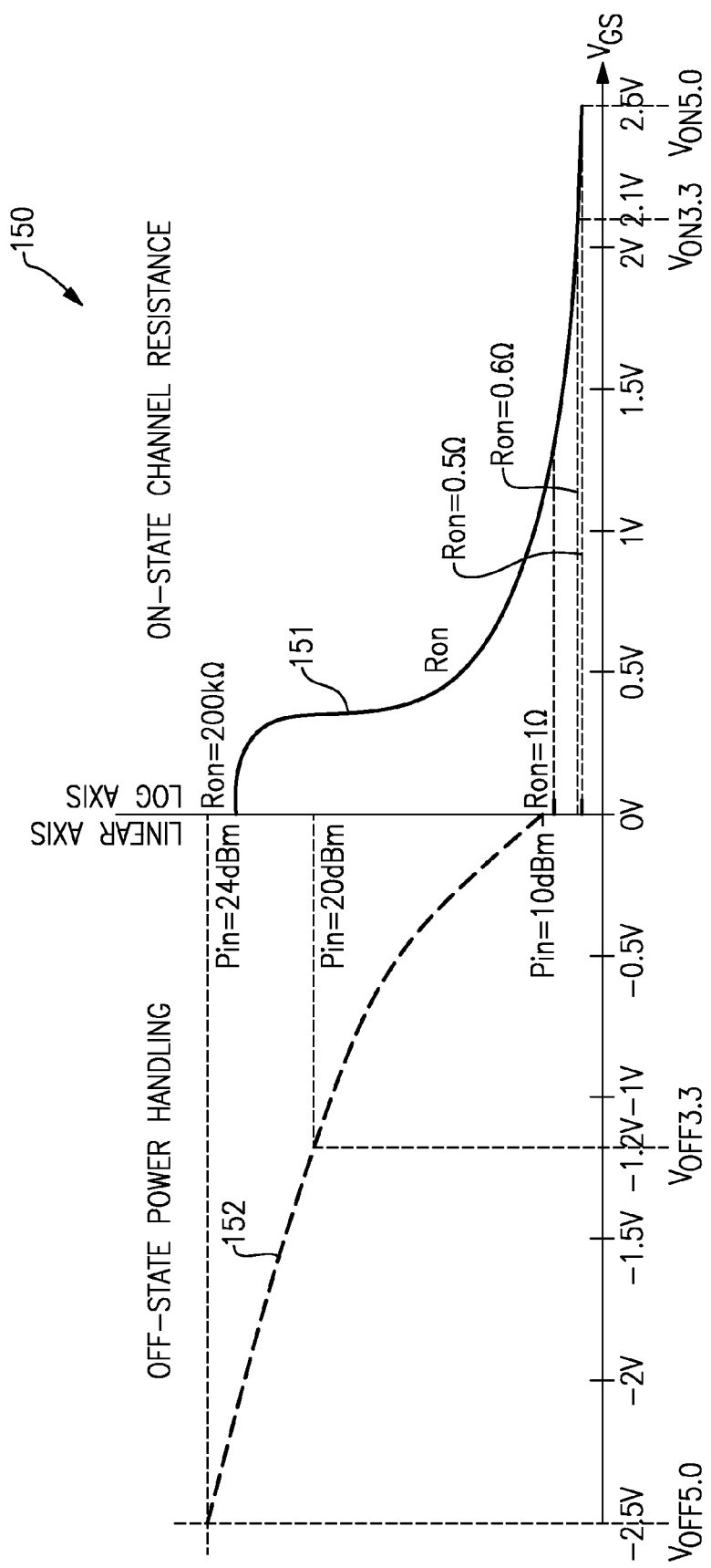
FIG. 6 is one example of a graph of on-state channel resistance and off-state power handling versus gate-to-source voltage.

FIG. 6 is one example of a graph 150 of on-state channel resistance and off-state power handling versus gate-to-source voltage ($V_{GS}$). The graph 150 includes a first plot 151 of on-state channel resistance (Ron) versus $V_{GS}$ and a second plot 152 of off-state power handling versus $V_{GS}$. The first plot 151 is plotted on a logarithmic axis, and the second plot 152 is plotted on a linear axis.

The illustrated graph 150 corresponds to on-state channel resistance and off-state power handling for one example of a 2.5 V FET switch fabricated using a specific manufacturing process. However, on-state channel resistance and/or off-state power handling characteristics can vary based on a wide variety of factors, including, for example, the FET switch's manufacturing process, geometry, and/or rated voltage.

The optimum bias voltages of a FET switch can be constrained by power supply voltage levels and/or transistor overvoltage limitations. For example, a voltage difference between a power high supply voltage $V_{HIGH}$ and a power low supply voltage $V_{LOW}$ may be greater than a maximum $V_{GS}$ voltage that the FET switch can reliably withstand.

The illustrated graph 150 corresponds to a FET switch that can be reliably operated with a maximum $V_{GS}$ voltage of about 2.5 V. Accordingly, when powering the FET switch with a 5.0 V power high supply voltage and 0.0 V power low supply voltage, the FET switch can be biased with an optimum switch turn-on voltage $V_{ON5.0}$ of about 2.5 V and an optimum switch turn-off voltage $V_{OFF5.0}$ of about −2.5 V. In such a configuration, the FET switch can have, for example, a channel biased to 2.5 V, and can be turned on and off by controlling the FET switch's gate voltage with 5.0 V power high supply voltage or with the 0.0 V power low supply voltage.

The optimum bias voltages for the FET switch associated with the graph 150 of FIG. 6 can change when the power high and power low supply voltages used to power the FET switch change. For instance, when powering the FET switch with a 3.3 V power high supply voltage and 0.0 V power low supply voltage, it is no longer optimum to control the channel voltage to 2.5 V. For instance, when the FET switch's channel is biased to 2.5 V and the FET switch is turned on and off by controlling the FET switch's gate voltage with the 3.3 V power high supply voltage or with the 0.0 V power low supply voltage, the turn-on voltage of the FET switch can be about equal to 0.8 V, which can result in the FET switch having unacceptably high on-state resistance. Thus, in the illustrated configuration, when powered using a 3.3 V supply the FET switch can have an optimum switch turn-on voltage $V_{ON3.3}$ of about 2.1 V and an optimum switch turn-off voltage $V_{GFF3.3}$ of about −1.2 V.

The adaptive switch bias circuits herein can control a magnitude of a switch turn-on voltage and a magnitude of a switch turn-off voltage based on the voltage difference between the power high and power low supply voltages. Additionally, the switch turn-on voltage and the switch turn-off voltage can be selected to provide a desired trade-off between on-state channel resistance and off-state power handling.

For instance, when the FET switch associated with the graph 150 of FIG. 6 is powered using a 5.0 V supply, the adaptive switch bias circuit can bias the FET switch with an optimum switch turn-on voltage $V_{ON5.0}$ of about 2.5 V and an optimum switch turn-off voltage $V_{OFF5.0}$ of about −2.5 V. Additionally, when is powered using a 3.3 V supply, the adaptive switch bias circuit can bias the FET switch with an optimum switch turn-on voltage $V_{ON3.3}$ of about 2.1 V and an optimum switch turn-off voltage $V_{OFF3.3}$ of about −1.2 V.

Although one specific example of optimum bias voltages has been described, optimum bias voltages can vary with a wide variety of factors, including, for example, transistor device characteristics, operating supply range, and/or application requirements. Accordingly, other values of optimum bias voltages are possible.

Applications

Devices employing the above described RF switching circuits can be implemented into various electronic devices. Examples of the electronic devices can include, but are not limited to, consumer electronic products, parts of the consumer electronic products, electronic test equipment, etc. Examples of the electronic devices can also include circuits of optical networks or other communication networks. The consumer electronic products can include, but are not limited to, an automobile, a camcorder, a camera, a digital camera, a portable memory chip, a washer, a dryer, a washer/dryer, a copier, a facsimile machine, a scanner, a multifunctional peripheral device, etc. Further, the electronic device can include unfinished products, including those for industrial, medical and automotive applications.

The foregoing description and claims may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the figures depict example arrangements of elements and components, additional intervening elements, devices, features, or components may be present in an actual embodiment (assuming that the functionality of the depicted circuits is not adversely affected).

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well. Accordingly, the scope of the present invention is defined only by reference to the appended claims.

What is claimed is:

1. A radio frequency (RF) switching circuit comprising:
   one or more field effect transistor (FET) switches comprising a first FET switch; and
   an adaptive switch bias circuit configured to control a gate voltage and a channel voltage of the first FET switch, wherein the adaptive switch bias circuit is configured to receive a switch enable signal, wherein the adaptive switch bias circuit is configured to bias the first FET switch with a turn-on voltage to turn on the first FET switch when the switch enable signal is in a first state, and wherein the adaptive switch bias circuit is configured to bias the first FET switch with a turn-off voltage to turn off the first FET switch when the switch enable signal is in a second state,
   wherein the adaptive switch bias circuit is configured to be powered by a power high supply voltage and a power low supply voltage, and wherein the adaptive switch bias circuit is configured to control a magnitude of the turn-on voltage and a magnitude of the turn-off voltage based on a voltage difference between the power high supply voltage and the power low supply voltage,
   wherein the adaptive switch bias circuit comprises:
      a supply dependent voltage generation circuit configured to receive the power high supply voltage and to generate a dependent voltage that changes in relation to a voltage level of the power high supply voltage, wherein the supply dependent voltage generation circuit is configured to generate a voltage drop; and
      a voltage divider configured to generate a bias voltage based on a voltage difference between the dependent voltage and the power low supply voltage.

2. The RF switching circuit of claim 1, wherein the adaptive switch bias circuit is configured to control the gate voltage of the first FET switch to the bias voltage.

3. The RF switching circuit of claim 2, wherein the adaptive switch bias circuit further comprises a switch control logic circuit configured to receive the switch enable signal, wherein when the switch enable signal is in the first state the switch control logic circuit controls the channel voltage of the first FET switch to the power high supply voltage, and wherein when the switch enable signal is in the second state the switch control logic circuit controls the channel voltage of the first FET switch to the power low supply voltage.

4. The RF switching circuit of claim 1, wherein the adaptive switch bias circuit is configured to control the channel voltage of the first FET switch to the bias voltage.

5. The RF switching circuit of claim 4, wherein the adaptive switch bias circuit further comprises a switch control logic circuit configured to receive the switch enable signal, wherein when the switch enable signal is in the first state the switch control logic circuit controls the gate voltage of the first FET switch to the power low supply voltage, and wherein when the switch enable signal is in the second state the switch control logic circuit controls the gate voltage of the first FET switch to the power high supply voltage.

6. The RF switching circuit of claim 1, wherein the supply dependent voltage generation circuit comprises a subtraction circuit configured to generate the dependent voltage by subtracting a predetermined amount of voltage from the power high supply voltage.

7. The RF switching circuit of claim 6, wherein the supply dependent voltage generation circuit further comprises a bandgap voltage reference circuit configured to generate the predetermined amount of voltage, wherein the predetermined amount of voltage comprises a bandgap reference voltage.

8. The RF switching circuit of claim 6, wherein the voltage divider comprises a first resistor and a second resistor electrically connected in series between the dependent voltage and the power low supply voltage.

9. The RF switching circuit of claim 1, wherein the one or more FET switches comprises a plurality of FET switches, wherein the adaptive switch bias circuit is configured to control a gate voltage and a channel voltage of each of the plurality of FET switches.

10. A radio frequency (RF) switching circuit comprising:
one or more field effect transistor (FET) switches comprising a first FET switch; and
an adaptive switch bias circuit configured to control a gate voltage and a channel voltage of the first FET switch, wherein the adaptive switch bias circuit is configured to receive a switch enable signal, wherein the adaptive switch bias circuit is configured to bias the first FET switch with a turn-on voltage to turn on the first FET switch when the switch enable signal is in a first state, and wherein the adaptive switch bias circuit is configured to bias the first FET switch with a turn-off voltage to turn off the first FET switch when the switch enable signal is in a second state,
wherein the adaptive switch bias circuit is configured to be powered by a power high supply voltage and a power low supply voltage, and wherein the adaptive switch bias circuit is configured to control a magnitude of the turn-on voltage and a magnitude of the turn-off voltage based on a voltage difference between the power high supply voltage and the supply voltage,
wherein the adaptive switch bias circuit includes a gate bias output configured to control the gate voltage of the first FET switch and a channel bias output configured to control the channel voltage of the first FET switch, wherein the RF switching circuit further comprises:
a gate bias resistor electrically connected between the gate bias output and a gate of the first FET switch; and
a first channel bias resistor electrically connected between the channel bias output and a source of the first FET switch; and
a second channel bias resistor electrically connected between the source of the first FET switch and a drain of the first FET switch.

11. The RF switching circuit of claim 10, further comprising:
an RF input terminal;
an RF output terminal;
a first DC blocking capacitor electrically connected between the RF input terminal and the source of the first FET switch; and
a second DC blocking capacitor electrically connected between the drain of the first FET switch and the RF output terminal.

12. The RF switching circuit of claim 10, wherein the adaptive switch bias circuit further comprises a switch control logic circuit configured to receive the switch enable signal, wherein when the switch enable signal is in the first state the switch control logic circuit controls the channel voltage of the first FET switch to the power high supply voltage, and wherein when the switch enable signal is in the second state the switch control logic circuit controls the channel voltage of the first FET switch to the power low supply voltage.

13. The RF switching circuit of claim 10, wherein the adaptive switch bias circuit comprises:
a supply dependent voltage generation circuit configured to receive the power high supply voltage and to generate a dependent voltage that changes in relation to a voltage level of the power high supply voltage, wherein the supply dependent voltage generation circuit is configured to generate a voltage drop; and
a voltage divider configured to generate a bias voltage based on a voltage difference between the dependent voltage and the power low supply voltage.

14. The RF switching circuit of claim 13, wherein the supply dependent voltage generation circuit comprises a subtraction circuit configured to generate the dependent voltage by subtracting a predetermined amount of voltage from the power high supply voltage.

15. The RF switching circuit of claim 14, wherein the supply dependent voltage generation circuit further comprises a bandgap voltage reference circuit configured to generate the predetermined amount of voltage, wherein the predetermined amount of voltage comprises a bandgap reference voltage.

16. The RF switching circuit of claim 13, wherein the voltage divider comprises a first resistor and a second resistor electrically connected in series between the dependent voltage and the power low supply voltage.

17. An electronically-implemented method of biasing a radio frequency (RF) switch, the method comprising:
powering an adaptive switch bias circuit using a power high supply voltage and a power low supply voltage;
controlling a magnitude of a turn-on voltage and a magnitude of a turn-off voltage based on a voltage difference between the power high supply voltage and the power low supply voltage;
generating a dependent voltage from the power high supply voltage using a supply dependent voltage generation circuit, wherein the dependent voltage changes in relation to a voltage level of the power high supply voltage;
generating a bias voltage based on dividing a voltage difference between the dependent voltage and the power low supply voltage using a voltage divider;
receiving a switch enable signal as an input to the adaptive switch bias circuit; and
controlling a gate voltage and a channel voltage of a first field effect transistor (FET) switch using the adaptive switch bias circuit, wherein controlling the gate voltage and the channel voltage of the first FET switch comprises:
biasing the first FET switch using the turn-on voltage when the switch enable signal is in a first state, and
biasing the first FET switch using the turn-off voltage when the switch enable signal is in a second state.

18. The method of claim 17, further comprising controlling the gate voltage of the first FET switch to the bias voltage.

19. The method of claim 18, further comprising controlling the channel voltage of the first FET switch to the power high supply voltage when the switch enable signal is in the first state, and controlling the channel voltage of the first FET switch to the power low supply voltage when the switch enable signal is in the second state.

20. The method of claim 17, further comprising controlling the channel voltage of the first FET switch to the bias voltage.

21. The method of claim 20, further comprising controlling the gate voltage of the first FET switch to the power low supply voltage when the switch enable signal is in the first state, and controlling the gate voltage of the first FET switch to the power high supply voltage when the switch enable signal is in the second state.

22. The method of claim 17, wherein generating the dependent voltage comprises shifting the power high supply voltage by a predetermined amount of voltage.

23. The method of claim 17, further comprising generating the reference voltage using a bandgap voltage reference circuit, wherein the predetermined amount of voltage comprises a bandgap reference voltage.

* * * * *